United States Patent
Zhang

(10) Patent No.: US 12,451,648 B2
(45) Date of Patent: Oct. 21, 2025

(54) CONNECTOR

(71) Applicant: BOZHOU LANTO ELECTRONIC LIMITED, Anhui (CN)

(72) Inventor: Mingchao Zhang, Anhui (CN)

(73) Assignee: BOZHOU LANTO ELECTRONIC LIMITED, Anhui (CN)

( * ) Notice: Subject to any disclaimer, the term of this patent is extended or adjusted under 35 U.S.C. 154(b) by 340 days.

(21) Appl. No.: 18/132,265

(22) Filed: Apr. 7, 2023

(65) Prior Publication Data
US 2023/0352877 A1 Nov. 2, 2023

(30) Foreign Application Priority Data
Apr. 29, 2022 (CN) .......................... 202210474294.6

(51) Int. Cl.
H01R 13/62 (2006.01)
H01R 13/40 (2006.01)
H01R 13/627 (2006.01)

(52) U.S. Cl.
CPC ......... H01R 13/6275 (2013.01); H01R 13/40 (2013.01)

(58) Field of Classification Search
CPC ............ H01R 13/6205; H01R 2201/12; H01R 13/2421; H01R 13/64; H01R 13/639; H01R 12/714; H01R 13/6271; H01R 13/629; H01R 13/641; H01R 2107/00; H01R 13/187; H01R 13/6272
See application file for complete search history.

(56) References Cited

U.S. PATENT DOCUMENTS

| | | | |
|---|---|---|---|
| 6,926,562 B1 | 8/2005 | Wu | |
| 7,481,664 B1 * | 1/2009 | Knoll | H01R 13/648 439/359 |
| 8,337,256 B1 * | 12/2012 | Lin | H01R 12/7094 439/700 |
| 2010/0233907 A1 * | 9/2010 | Wu | H01R 13/447 439/607.58 |

(Continued)

FOREIGN PATENT DOCUMENTS

| | | |
|---|---|---|
| CN | 205621948 A | 10/2016 |
| CN | 107359441 A | 11/2017 |

(Continued)

OTHER PUBLICATIONS

Japanese Office Action for Japanese Application No. 2023-067912, dated Mar. 12, 2024, with English translation.

*Primary Examiner* — Truc T Nguyen
(74) *Attorney, Agent, or Firm* — Birch, Stewart, Kolasch & Birch, LLP

(57) ABSTRACT

Provided is a connector. The connector is configured to electrically connect a docking element to a circuit board. The connector includes an insulation body, a pogo pin, a clip, a hook member, and a metal casing. The insulation body includes a base and a plug-in portion disposed at one end of the base. The plug-in portion is provided with a slot for accommodating the docking element. The pogo pin is disposed on the insulation body, where one end of the pogo pin is accommodated in the slot, and another end of the pogo pin is exposed outside the base. The clip is disposed on the plug-in portion, and part of the clip extends into the slot to abut the docking element.

10 Claims, 10 Drawing Sheets

(56) References Cited

U.S. PATENT DOCUMENTS

| | | | |
|---|---|---|---|
| 2011/0059642 A1* | 3/2011 | Slippy | H01R 13/5808 |
| | | | 439/449 |
| 2014/0260443 A1* | 9/2014 | Grziwok | E05B 65/00 |
| | | | 70/57 |
| 2015/0280343 A1* | 10/2015 | Hsu | H01R 13/2421 |
| | | | 29/884 |
| 2017/0338578 A1* | 11/2017 | Zhang | H01R 13/516 |
| 2018/0145449 A1* | 5/2018 | Wei | H01R 13/6581 |
| 2018/0294596 A1* | 10/2018 | Zhang | H01R 13/24 |
| 2018/0375263 A1* | 12/2018 | Zhong | H01R 13/6275 |
| 2020/0220297 A1* | 7/2020 | Zhang | H01R 13/521 |
| 2020/0291689 A1* | 9/2020 | Shiu | E05B 65/0067 |
| 2021/0367381 A1* | 11/2021 | Lv | H01R 13/6582 |
| 2022/0368059 A1* | 11/2022 | Pachoud | H01R 13/639 |
| 2024/0319387 A1* | 9/2024 | Choi | H05K 5/0221 |

FOREIGN PATENT DOCUMENTS

| | | |
|---|---|---|
| CN | 110311243 A | 10/2019 |
| CN | 113067181 A | 7/2021 |
| CN | 215869918 U | 2/2022 |
| CN | 216015745 U | 3/2022 |
| JP | 2013-246962 A | 12/2013 |
| JP | 2013-247008 A | 12/2013 |

* cited by examiner

CONNECTOR

CROSS-REFERENCE TO RELATED APPLICATION

This application claims priority to Chinese Patent Application No. 202210474294.6 filed Apr. 29, 2022, the disclosure of which is incorporated herein by reference in its entirety.

TECHNICAL FIELD

The present disclosure relates to the technical field of connector and, in particular, a connector.

BACKGROUND

As a signal transfer component, a connector is widely used in an electronic product such as a computer or a mobile phone. Since the connector plays an important role in the entire electrical connection system, the stability and reliability of the connector directly affect the quality of the electronic product. At present, the connector needs to meet higher grounding requirements and has a better plugging force, so as to shield the signal interference and achieve good contact and durability. However, to meet the preceding requirements, the existing connector usually needs precise and complex assembly procedures (such as laser welding) for fixing various parts of the connector, which is not only time-consuming and laborious, but also costly.

SUMMARY

The present disclosure provides a connector with stable signal transmission and stably connection with a docking element. This connector is easy and convenient to assemble and does not require precise and complex assembly procedures for fixing various parts of the connector.

To achieve the preceding object, the solution described below is provided.

A connector configured to electrically connect a docking element to a circuit board is provided. The connector includes an insulation body, a pogo pin, a clip, a hook member, and a metal casing.

The insulation body includes a base and a plug-in portion disposed at one end of the base, where the plug-in portion is provided with a slot for accommodating the docking element.

The pogo pin is configured to be inserted into the insulation body, where one end of the pogo pin is accommodated in the slot to be in electrical contact with the docking element, and another end of the pogo pin is exposed outside the base to be electrically connected to the circuit board.

The clip disposed on the plug-in portion, where part of the clip extends into the slot to abut the docking element.

The hook member includes a base portion, a prong, and a hook, where the prong and the hook are each connected to the base portion, the base portion abuts one end of the base facing away from the plug-in portion, the prong is inserted into the base, and the hook extends into the slot after passing through the base and the plug-in portion in sequence.

The metal casing includes a frame casing and a holding portion disposed on the frame casing, wherein the frame casing is sleeved on an outer periphery of the plug-in portion and abuts the clip, and the holding portion is inserted into the base and abuts the hook member.

In an embodiment, the base portion includes an elongated segment and a bent segment connected to the elongated segment, the bent segment extends in a width direction of the elongated segment, the prong is connected to the elongated segment, the hook is connected to the bent segment, and each of the prong and the hook extends in a thickness direction of the elongated segment.

In an embodiment, the hook includes a main arm, an extension arm, and a protrusion portion, one end of the extension arm is connected to the bent segment through the main arm, another end of the extension arm is provided with the protrusion portion, the protrusion portion extends into the slot, and the holding portion abuts the main arm and the bent segment.

In an embodiment, the one end of the base facing away from the plug-in portion is provided with a first receptacle, a slot wall of the slot is provided with a second receptacle, the first receptacle is communicated with the second receptacle, and the hook is inserted into the first receptacle and the second receptacle.

In an embodiment, the base is provided with a third receptacle which is communicated with the first receptacle, two ends of the third receptacle are communicated to two ends of the base respectively, and the holding portion is inserted into the third receptacle.

In an embodiment, the pogo pin includes a barrel, a pin head, and a plug pin, wherein the barrel is inserted into the insulation body, the pin head is telescopically disposed at one end of the barrel and accommodated in the slot to be in electrical contact with the docking element, and the plug pin is connected to another end of the barrel and exposed outside the base to be electrically connected to the circuit board.

In an embodiment, an outer surface of the base is provided with an accommodation recess which is communicated to the one end of the base facing away from the plug-in portion, and the another end of the pogo pin is accommodated in the accommodation recess.

In an embodiment, the insulation body is provided with a fixing hole for the pogo pin to extend through, Two ends of the fixing hole are communicated with the slot and the accommodation recess respectively, a recess bottom of the accommodation recess is provided with a limit slot which is communicated with the fixing hole, and the limit slot cooperates with the fixing hole to limit the pogo pin in an axial direction of the fixing hole.

In an embodiment, the clip includes a fixing portion and a bent portion connected to each other, an outer surface of the plug-in portion is provided with a positioning slot and a through hole which are communicated with each other, the through hole is communicated with the slot, the fixing portion is accommodated in the positioning slot and abuts the frame casing, the bent portion extends into the slot via the through hole to abut the docking element.

In an embodiment, the clip further includes a leg connected to the fixing portion, the outer surface of the plug-in portion is provided with a fourth receptacle, the fourth receptacle is communicated with the positioning slot, and the leg is inserted into the fourth receptacle.

BRIEF DESCRIPTION OF DRAWINGS

To illustrate the solution in embodiments of the present disclosure more clearly, the drawings used in description of the embodiments will be briefly described below. Apparently, the drawings described below merely illustrate part of the embodiments of the present disclosure.

REFERENCE LIST

Figure 1:
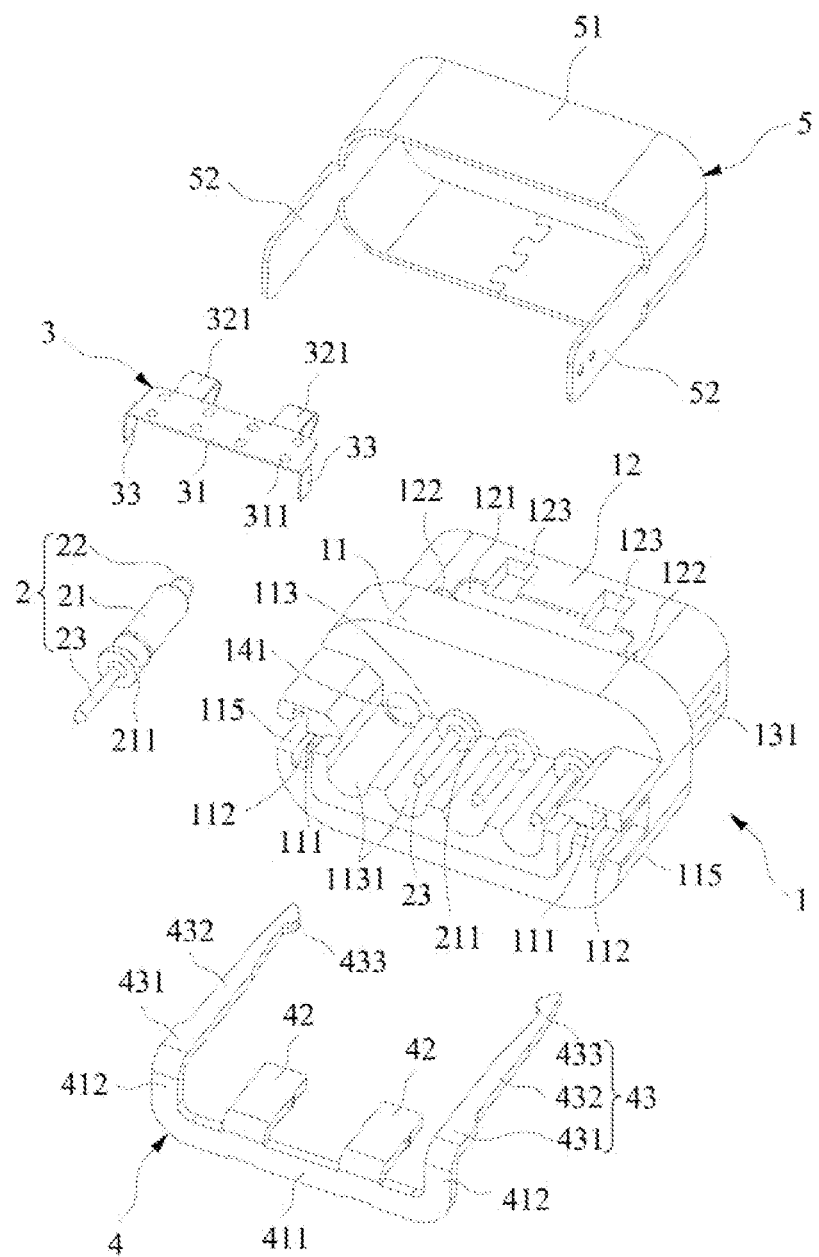
FIG. 1 is an exploded view one illustrating the structure of a connector according to an embodiment of the present disclosure.

1 insulation body
11 base
111 first receptacle
112 third receptacle
113 accommodation recess
1131 limit slot
114 fifth receptacle
115 avoidance recess
12 plug-in portion
121 positioning slot
122 fourth receptacle
123 through hole
13 slot
131 second receptacle
14 fixing hole
141 first fixing hole
142 second fixing hole
2 pogo pin
21 barrel
211 socket
22 pin head
23 pin
3 clip
31 fixing portion
311 protrusion
32 bent portion
321 first bent segment
322 second bent segment
33 leg
4 hook member
41 base portion
411 elongated segment
412 bent segment
42 prong
43 hook
431 main arm
432 extension arm
433 protrusion portion
5 metal casing
51 frame casing
52 holding portion

DETAILED DESCRIPTION

The solution of the present disclosure will be described below in conjunction with the drawings and the embodiment from which the solution will be apparent to those skilled in the art.

In the description of the present disclosure, it is to be noted that the orientational or positional relationships indicated by terms "above". "below", "left". "right", "vertical", "horizontal", "inside", and "outside" are based on the drawings. These orientations or position relations are intended only to facilitate and simplify the description of the present disclosure and not to indicate or imply that a device or element referred to must have such particular orientations or must be configured or operated in such particular orientations. Thus, these orientations or position relations are not to be construed as limiting the present disclosure. Moreover, terms such as "first" and "second" are used only for the purpose of description and are not to be construed as indicating or implying relative importance.

In the description of the present disclosure, it is to be noted that unless otherwise specified and limited, terms "mounted", "joined", and "connected" are to be understood in a broad sense. For example, the term "connected" may refer to "securely connected", "detachably connected" or "integrated", may refer to "mechanically connected" or "electrically connected", or may refer to "connected directly", "connected indirectly through an intermediary" or "connected inside two components". For those of ordinary skill in the art, specific meanings of the preceding terms in the present disclosure may be construed based on specific situations.

Technical solutions of the present disclosure are further described hereinafter in conjunction with the drawings and the embodiments.

Figure 2:
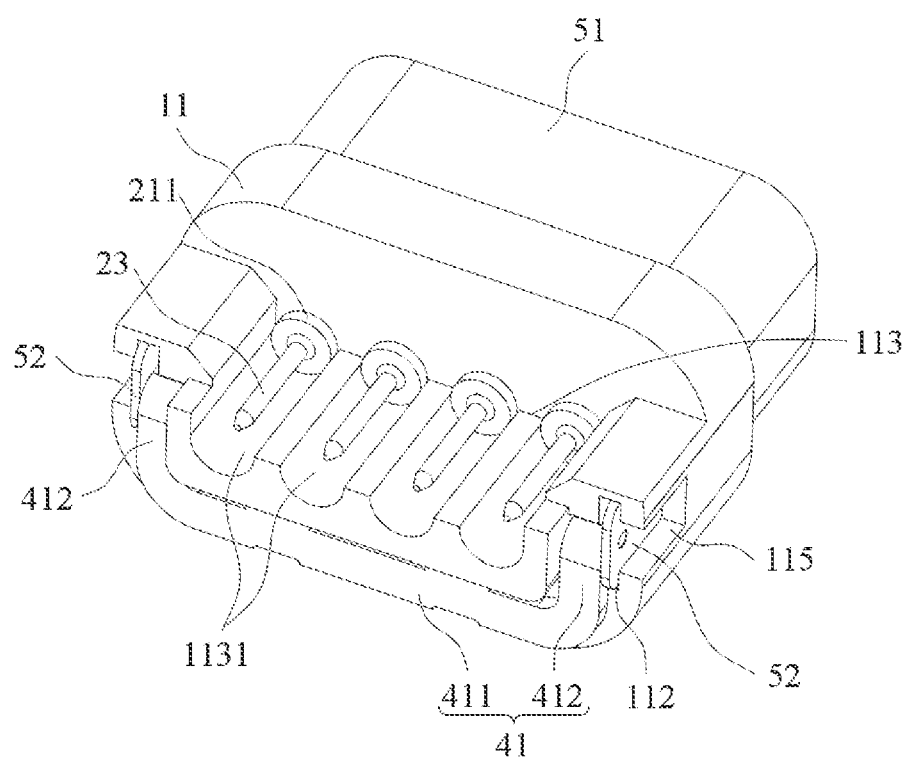
FIG. 2 is a view one illustrating the structure of a connector according to an embodiment of the present disclosure.
Figure 3:
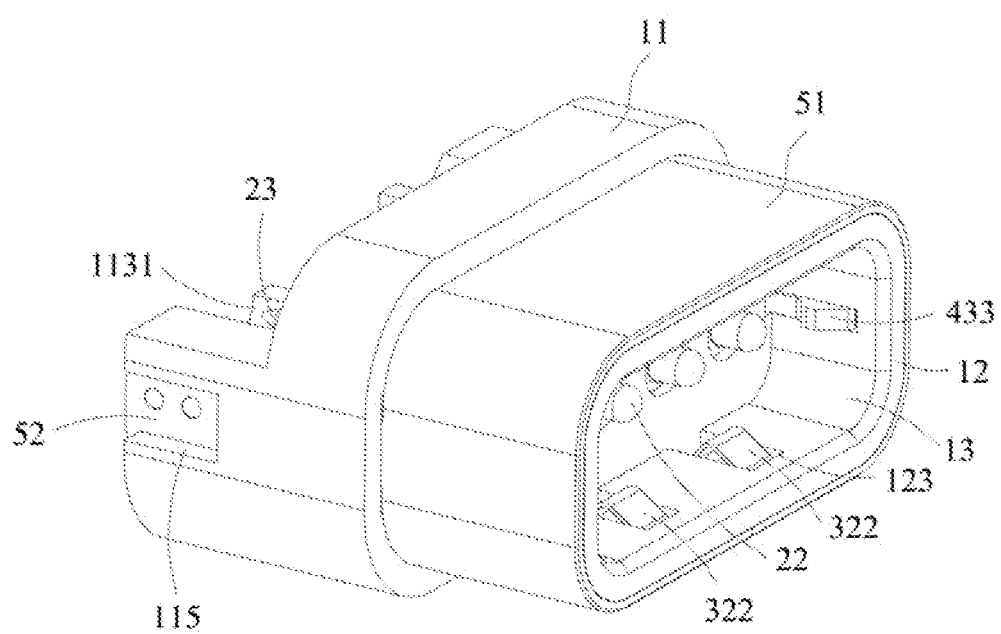
FIG. 3 is a view two illustrating the structure of a connector according to an embodiment of the present disclosure.

As shown in FIGS. 1 to 3, an embodiment of the present disclosure provides a connector. The connector is configured to electrically connect a docking element to a circuit board. The connector includes an insulation body 1, a pogo pin 2, a clip 3, a hook member 4, and a metal casing 5. The insulation body 1 includes a base 11 and a plug-in portion 12 disposed at one end of the base 11. An end face of the plug-in portion 12 facing away from the base 11 is provided with a slot 13. The slot 13 is configured for the connector to dock with an external electrical plug. The pogo pin 2 is disposed on the insulation body 1. One end of the pogo pin 2 is accommodated in the slot 13 to be in electrical contact with the docking element located in the slot 13, and the other end of the pogo pin 2 is exposed outside the base 11 to be mounted to the circuit board for electrical connection. The clip 3 is disposed on the plug-in portion 12. Part of the clip 3 extends into the slot 13. The hook member 4 includes a base portion 41, a prong 42, and a hook 43. The prong 42 and the hook 43 are each connected to the base portion 41. The base portion 41 abuts an end face of the base 11 facing away from the plug-in portion 12. The prong 42 is configured to be inserted into the base 11. The hook 43 extends into the slot 13 after passing through the base 11 and the plug-in portion 12 in sequence and extends into the slot 13. The metal casing 5 includes a frame casing 51 and a holding portion 52 disposed on the frame casing 51. The frame casing 51 is sleeved on the outer periphery of the plug-in portion 12 and abuts the clip 3. The holding portion 52 is inserted into the base 11 and abuts the hook 43.

In the connector of this embodiment, the pogo pin 2 is disposed on the insulation body 1 so that the connector transmits an electrical signal to electrically connect the docking element to the circuit board. The connector uses the part of the clip 3 extending into the slot 13 to form the elastic abutment to the docking element, effectively improving the plugging force, making the plugging connection between the connector and the docking element stable, and ensuring good contact and fatigue durability of the connector. The frame casing 51 is sleeved on the outer periphery of the plug-in portion 12 to abut the clip 3, so as to ensure the clip 3 to be stably and securely assembled. The contact conduction between the hook member 4 and the holding portion 52 of the metal casing 5 is achieved so that the connector is reliably grounded, facilitating ensuring the stable signal transmission of the connector. Moreover, the prong 42 is inserted into the base 11 to fix the hook member 4 so that not only the movement of the hook member 4 during connector plugging can be avoided, but also the assembly is easy and convenient, saving complex assembly procedures. The connector of the present disclosure shields the signal interference and has good contact and durability. Moreover, the connector is simple in overall structure, convenient to assemble, and does not require precise and complex assembly procedures.

Figure 4:
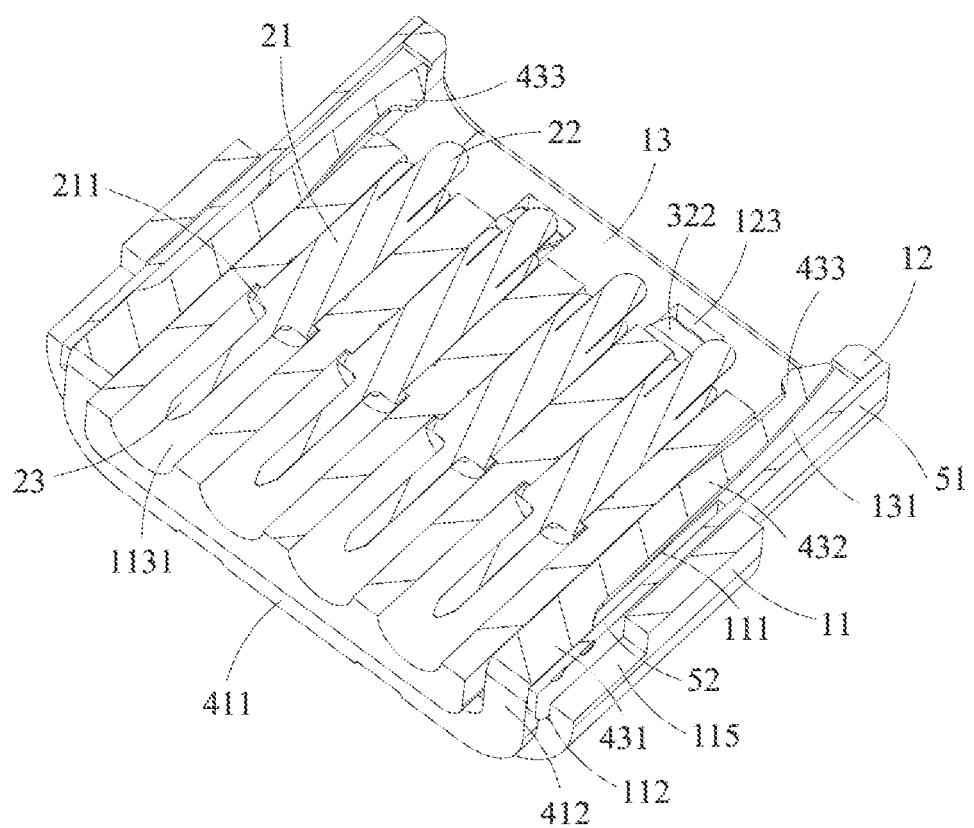
FIG. 4 is a sectional view one illustrating a connector according to an embodiment of the present disclosure.

Optionally, referring to FIGS. 1 and 4, the base portion 41 includes an elongated segment 411 and two bent segments 412 connected to two ends of the elongated segment 411, respectively. Each bent segment 412 extends in a width direction of the elongated segment 411. The elongated segment 411 and the two bent segments 412 abut one end of the base 11 facing away from the plug-in portion 12. The prong 42 and the hook 43 are located on the same side of the base portion 41. Two prongs 42 are provided and spaced apart in a length direction of the elongated segment 411. Each prong 42 is connected to the elongated segment 411 and extends in a thickness direction of the elongated segment 411. Each bent segment 412 is provided with one hook 43. The hook 43 is connected to the bent segment 412 and extends in the thickness direction of the elongated segment 411. The elongated segment 411 and the bent segments 412 constituting the base portion 41 extend in different directions, the prongs 42 and the hooks 43 are distributed in the width direction of the elongated segment 411, and the prongs 42 and the hooks 43 extend in the thickness direction of the elongated segment 411, so that the stability of the hook member 4 mounted on the insulation body 1 is enhanced.

Optionally, referring to FIGS. 1 and 4, the hook 43 includes a main arm 431, an extension arm 432, and a protrusion portion 433. One end of the extension arm 432 is connected to the bent segment 412 through the main arm 431. The other end of the extension arm 432 is provided with the protrusion portion 433. The protrusion portion 433 extends into the slot 13. In the length direction of the elongated segment 411, a width of the main arm 431 is larger than a width of the extension arm 432. The holding portion 52 abuts the main arm 431 and the bent segment 412. There is a gap between the extension arm 432 and the metal casing 5. The main arm 431 and the extension arm 432 cooperates so that the hook 43 is stably and securely inserted in the insulation body 1. The extension arm 432 and the protrusion 433 cooperates so that the protrusion portion 433 can abut the docking element which is plugged into the connector, thereby enhancing the fatigue durability of the connector.

Figure 5:
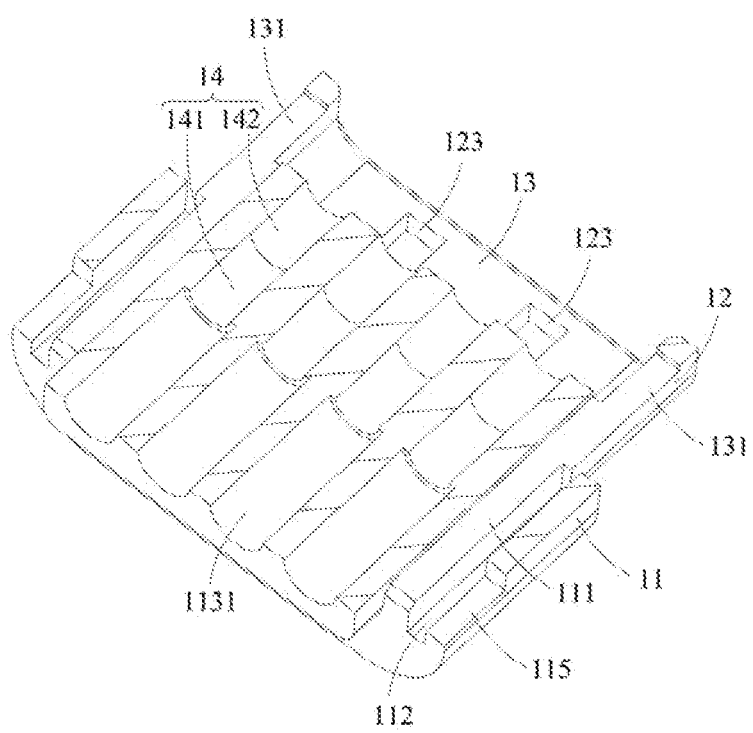
FIG. 5 is a sectional view illustrating an insulation body according to an embodiment of the present disclosure.
Figure 6:
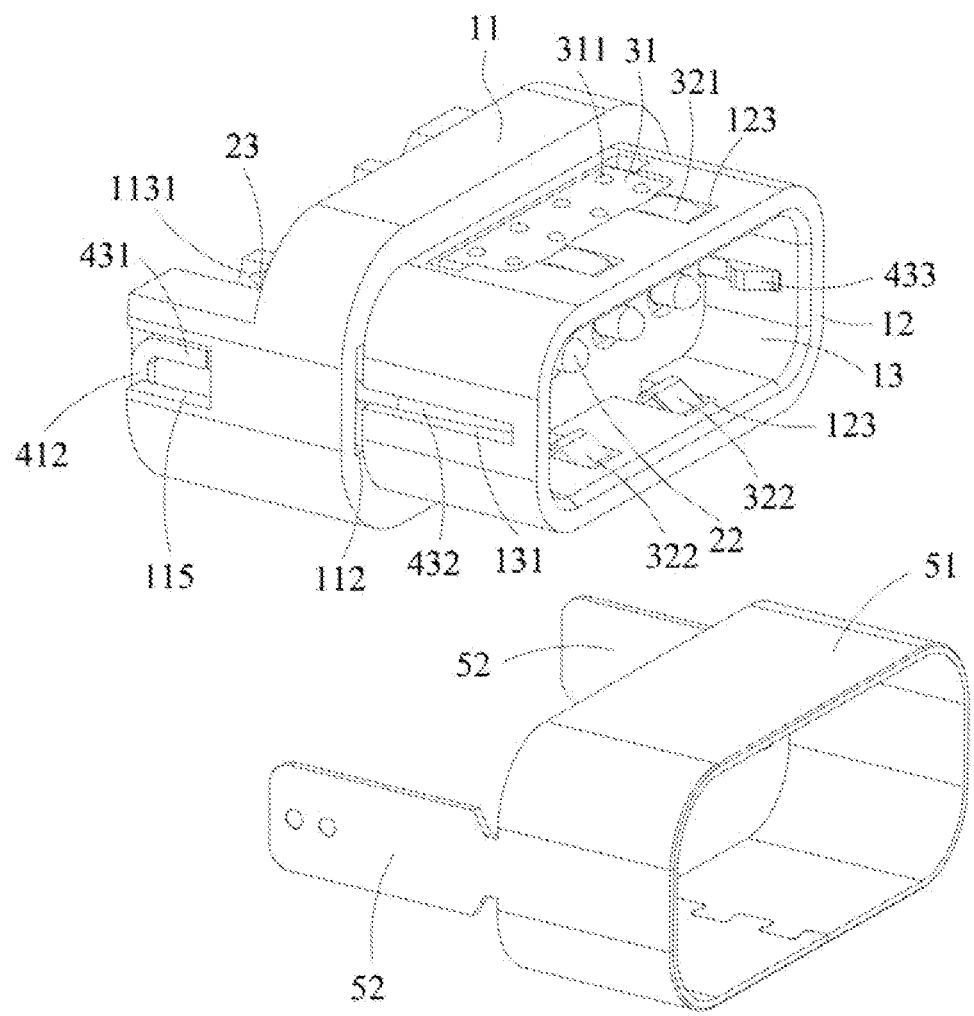
FIG. 6 is an exploded view two illustrating the structure of a connector according to an embodiment of the present disclosure.

Optionally, referring to FIGS. 4 to 6, one end of the base 11 facing away from the plug-in portion 12 is provided with a first receptacle 111. The slot wall of the slot 13 is provided with a second receptacle 131. The second receptacle 131 communicates to the outer surface of the plug-in portion 12. The first receptacle 111 is communicated with the second receptacle 131. The hook 43 is inserted into the first receptacle 111 and the second receptacle 131, where the main arm 431 is inserted into the first receptacle 111, the extension arm 432 is inserted into the first receptacle 1 and the second receptacle 131, and the protrusion portion 433 extends into the slot 13 through the second receptacle 131. The first receptacle 111 and the second receptacle 131 are provided on the insulation body 1 so that the main arm 431 of the hook 43 is inserted from one end of the base 11 facing away from the plug-in portion 12 to allow the protrusion portion 433 of the hook 43 to extend into the slot 13.

Optionally, the number of first receptacles 111 on the base 11 and the number of second receptacles 131 on the slot wall of the slot 13 are set according to the number of hooks 43 such that each hook 43 is correspondingly inserted into one first receptacle 111 and one second receptacle 131 which is communicated with each other.

Optionally, referring to FIGS. 4 to 7, the base 11 is provided with a third receptacle 112 which is communicated with the first receptacle 111. Two ends of the third receptacle 112 are communicated with two ends of the base 11, respectively. The holding portion 52 is inserted into the third receptacle 112. It is to be noted that in the direction of the base 11 toward the plug-in portion 12, a cross-sectional area of the plug-in portion 12 is smaller than a cross-sectional area of the base 11 so that the third receptacle 112 extends through the two ends of the base 11. The third receptacle 112 communicating with the first receptacle 111 is provided so that the holding portion 52 inserted into the third receptacle 112 can abut the main arm 431 inserted into the first receptacle 111, thereby ensuring that the hook member 4 mates with the insulation body 1.

Figure 7:
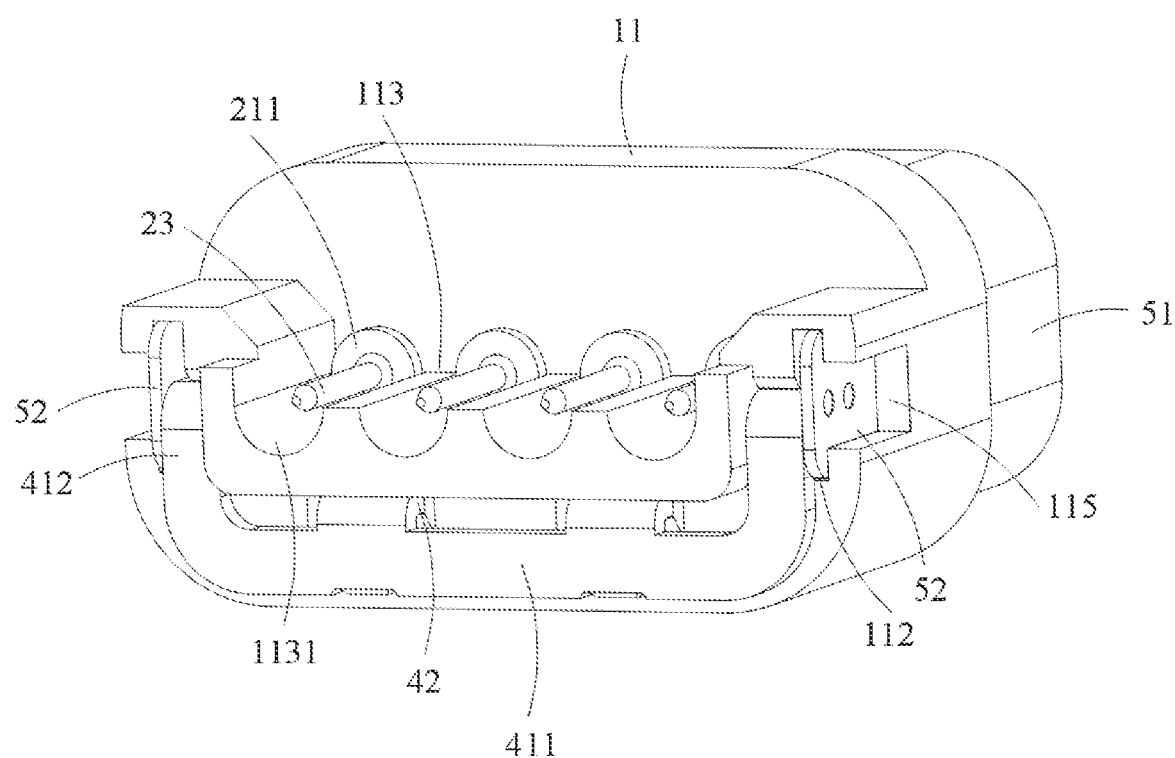
FIG. 7 is a view three illustrating the structure of a connector according to an embodiment of the present disclosure.
Figure 8:
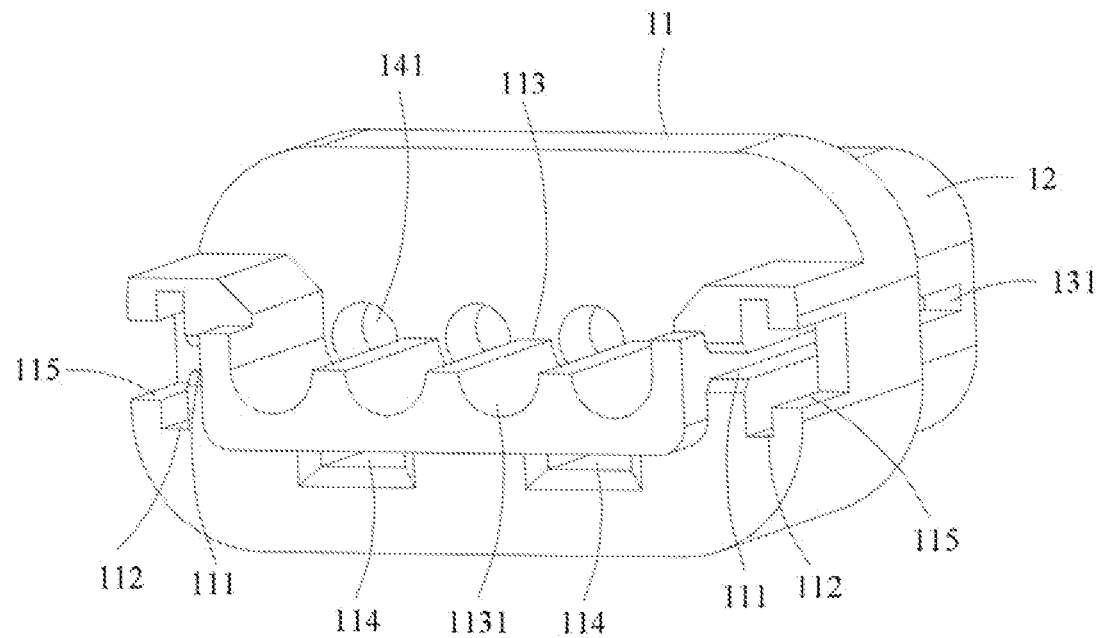
FIG. 8 is a view illustrating the structure of an insulation body according to an embodiment of the present disclosure.

Optionally, referring to FIGS. 6 to 8, the holding portion 52 is flaky in shape. Two holding portions 52 are provided and spaced apart on one end face of the frame casing 51. Two third receptacles 112 are provided on the base 11. Each of the two holding portions 52 is inserted into a respective one of the two third receptacles 112. The two holding portions 52 and the two third receptacles 112 cooperate so that the metal casing 5 is mated with the insulation body 1. Moreover, each of the two holding portions 52 contacts a respective one of the two bent segments 412 and a respective one of the two main arms 431 to ensure that the connector is reliably grounded.

Optionally, referring to FIGS. 7 and 8, the outer surface of the base 11 is provided with an avoidance recess 115. The avoidance recess 115 is communicated with the third receptacle 112. Part of the holding portion 52 is exposed outside the base 11 through the avoidance recess 115.

Optionally, referring to FIGS. 7 and 8, one end of the base 11 facing away from plug-in portion 12 is provided with two fifth receptacles 114 that are spaced apart. Each of the two prongs 42 is inserted into a respective one of the two fifth receptacles 114.

Optionally, referring to FIGS. 1 to 3, the pogo pin 2 includes a barrel 21, a pin head 22, and a plug pin 23. The barrel 21 is inserted into a fixing hole 14. The pin head 22 is telescopically mounted on one end of the barrel 21 in the axial direction of the barrel 21 and accommodated in the slot 13. As one end of the pogo pin 2, the pin head 22 can be in electrical contact with the docking element accommodated in the slot 13. Specifically, a spring structure is mounted within the barrel 21, and the pin head 22 is connected to the spring structure, so that the pin head 22 can be telescopically mounted on one end of the barrel 21. Further, as the other end of the pogo pin 2, the plug pin 23 is connected to the other end of the barrel 21 through the socket 211 and exposed outside the base 11, so that the plug pin 23 facilitates mounting the pogo pin 2 to the circuit board, thereby achieving electrically connection of the other end of the pogo pin 2 to the circuit board.

Optionally, referring to FIGS. 7 and 8, the outer surface of the base 11 is provided with an accommodation recess 113 communicating to one end of the base 11 facing away from the plug-in portion 12. The plug pin 23, which is the other end of the pogo pin 2, is accommodated in the accommodation recess 113. The accommodation recess 113 is provided on the base 11 so that the plug pin 23 is exposed outside the base 11, facilitating mounting the pogo pin 2 to the circuit board.

Optionally, referring to FIGS. 4 and 5, the insulation body 1 is provided with a fixing hole 14 for the pogo pin 2 to extend through. Two ends of the fixing hole 14 are communicated with the slot 13 and the accommodation recess 113, respectively. The recess bottom of the accommodation recess 113 is provided with a limit slot 1131 which is communicated with the fixing hole 14. The limit slot 1131 extends to one end of the base 11 facing away from the plug-in portion 12 in the axial direction of the fixing hole 14. Here, a width of the limit slot 1131 is larger than a diameter of the fixing hole 14. The socket 211 is accommodated in the limit slot 1131. The size of the socket 211 is matched with the limit slot 1131. The limit slot 1131 and the fixing hole 14 cooperates to limit the socket 211 in the axial direction of the fixing hole 14 so that the pogo pin 2 is securely mounted on the insulation body 1, thereby ensuring that the pogo pin 2 is not affected when the plug pin 23 is mounted to the circuit board.

Optionally, referring to FIG. 5, the fixing hole 14 includes a first fixing hole 141 disposed on the base 11 and a second fixing hole 142 disposed on the plug-in portion 12. Two ends of the second fixing hole 142 are communicated with the slot 13 and the first fixing hole 141, respectively. One end of the first fixing hole 141 facing away from the second fixing hole 142 is communicated with the accommodation recess 113.

Optionally, in this embodiment, referring to FIGS. 7 and 8, the recess bottom of the accommodation recess 113 extends facing away from the plug-in portion 12 to protrude outward with respect to the end face of the base 11 facing away from the plug-in portion 12, so as to protect the hook member 4 and the holding portion 52.

Optionally, referring to FIGS. 1, 6, 9, and 10, the clip 3 includes a fixing portion 31 and a bent portion 32 connected to each other. Further, the outer surface of the plug-in portion 12 is provided with a positioning slot 121 and a through hole 123 communicating with each other. The through hole 123 is communicated with the slot 13. The fixing portion 31 is accommodated in the positioning slot 121 and abuts the frame casing 51 so that the fixing portion 31 is sandwiched between the frame casing 51 and the plug-in portion 12 to allow the clip 3 to be securely mounted on the insulation body 1. The bent portion 32 extends into the slot 13 through the through hole 123 to abut the docking element. The bent portion 32 can elastically abut the docking element plugged in the connector, thereby increasing the plugging force of the connector, and ensuring the plugging connection between the connector and the docking element to be stable.

Optionally, referring to FIGS. 1, 6, 9, and 10, the clip 3 further includes a leg 33 connected to the fixing portion 31. The leg 33 extends in the thickness direction of the fixing portion 31. The outer surface of the plug-in portion 12 is provided with a fourth receptacle 122. The fourth receptacle is communicated with the positioning slot 121. The leg 33 is inserted into the fourth receptacle 122. The fixing portion 31 and the legs 33 cooperates to further improve the stability and secureness of the clip 3 mounted on the insulation body 1, thereby preventing the clip 3 from shifting during connector plugging.

Figure 9:
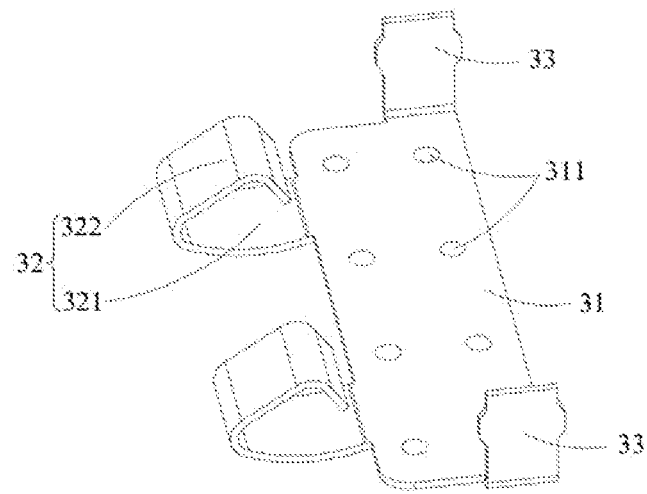
FIG. 9 is a view illustrating the structure of a clip according to an embodiment of the present disclosure.
Figure 10:
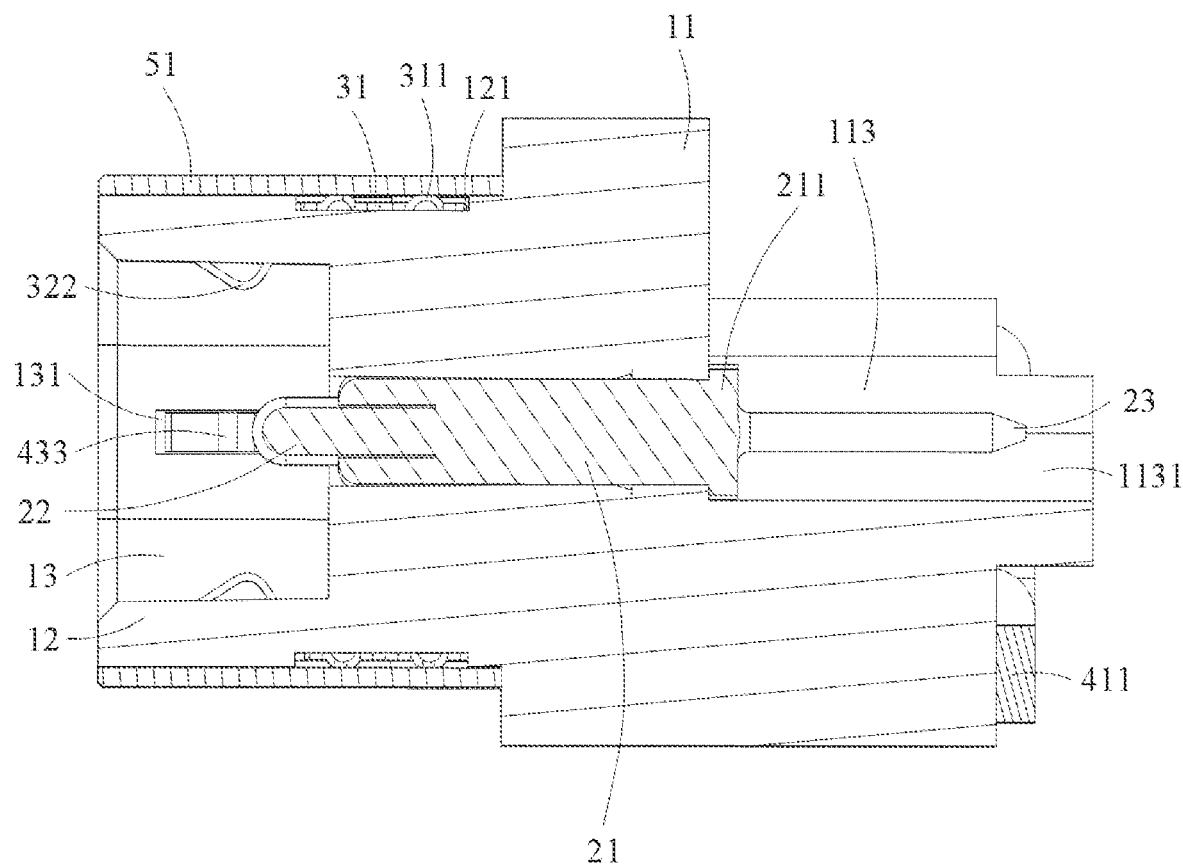
FIG. 10 is a sectional view two illustrating a connector according to an embodiment of the present disclosure.

Optionally, referring to FIGS. 9 and 10, the fixing portion 31 is platy in shape. The fixing portion 31 is provided with a protrusion 311 which abuts the frame casing 51 so that the clip 3 is mated with the metal casing 5 and the insulation body 1.

Figure 11:
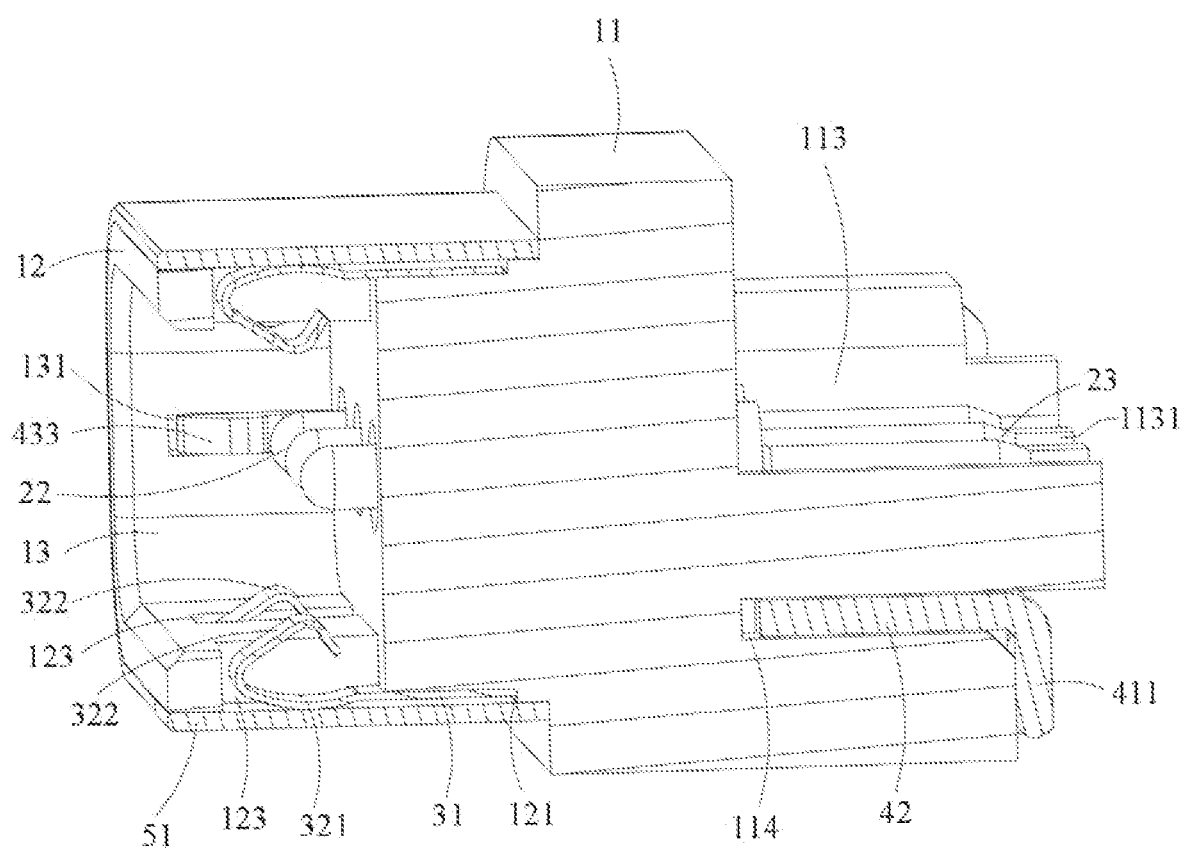
FIG. 11 is a sectional view three illustrating a connector according to an embodiment of the present disclosure.

Optionally, referring to FIGS. 9 and 11, the bent segment 32 includes a first bent segment 321 and a second bent segment 322. One end of the second bent segment 322 is connected to the fixing section 31 through the first bent segment 321. The first bent segment 321 abuts the frame casing 51. The second bent segment 322 is hooky in shape. The other end of the second bent segment 322 faces the fixing section 31. The second bent segment 322 extends into the slot 13 through the through hole 123 to elastically abut the docking element plugged in the connector.

It is to be noted that the preceding are only preferred embodiments of the present disclosure and technical principles used therein. It is to be understood by those skilled in the art that the present disclosure is not limited to the embodiment described herein. Those skilled in the art can make various apparent modifications, adaptations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A connector configured to electrically connect a docking element to a circuit board, comprising:
    an insulation body comprising a base and a plug-in portion disposed at one end of the base, wherein the plug-in portion is provided with a slot for accommodating the docking element;
    a pogo pin configured to be inserted into the insulation body, wherein one end of the pogo pin is accommodated in the slot to be in electrical contact with the docking element, and another end of the pogo pin is exposed outside the base to be electrically connected to the circuit board;
    a clip disposed on the plug-in portion, wherein part of the clip extends into the slot to abut the docking element;
    a hook member comprising a base portion, a prong, and a hook, wherein the prong and the hook are each connected to the base portion, the base portion abuts one end of the base facing away from the plug-in portion, the prong is inserted into the base, and the hook extends into the slot after passing through the base and the plug-in portion in sequence; and
    a metal casing comprising a frame casing and a holding portion disposed on the frame casing, wherein the frame casing is sleeved on an outer periphery of the plug-in portion and abuts the clip, and the holding portion is inserted into the base and abuts the hook member.

2. The connector according to claim 1, wherein the base portion comprises an elongated segment and a bent segment connected to the elongated segment, the bent segment extends in a width direction of the elongated segment, the prong is connected to the elongated segment, the hook is connected to the bent segment, each of the prong and the hook extends in a thickness direction of the elongated segment.

3. The connector according to claim 2, wherein the hook comprises a main arm, an extension arm, and a protrusion portion, one end of the extension arm is connected to the bent segment through the main arm, another end of the extension arm is provided with the protrusion portion, the protrusion portion extends into the slot, and the holding portion abuts the main arm and the bent segment.

4. The connector according to claim 1, wherein the one end of the base facing away from the plug-in portion is provided with a first receptacle, a slot wall of the slot is provided with a second receptacle, the first receptacle is communicated with the second receptacle, and the hook is inserted into the first receptacle and the second receptacle.

5. The connector according to claim 4, wherein the base is provided with a third receptacle which is communicated with the first receptacle, two ends of the third receptacle are communicated to two ends of the base respectively, and the holding portion is inserted into the third receptacle.

6. The connector according to claim 1, wherein the pogo pin comprises a barrel, a pin head, and a plug pin, wherein the barrel is inserted into the insulation body, the pin head is telescopically disposed at one end of the barrel and accommodated in the slot to be in electrical contact with the docking element, and the plug pin is connected to another end of the barrel and exposed outside the base to be electrically connected to the circuit board.

7. The connector according to claim 1, wherein an outer surface of the base is provided with an accommodation recess which is communicated to the one end of the base facing away from the plug-in portion, and the another end of the pogo pin is accommodated in the accommodation recess.

8. The connector according to claim 7, wherein the insulation body is provided with a fixing hole for the pogo pin to extend through, Two ends of the fixing hole are communicated with the slot and the accommodation recess respectively, a recess bottom of the accommodation recess is provided with a limit slot which is communicated with the fixing hole, and the limit slot cooperates with the fixing hole to limit the pogo pin in an axial direction of the fixing hole.

9. The connector according to claim 1, wherein the clip comprises a fixing portion and a bent portion connected to each other, an outer surface of the plug-in portion is provided with a positioning slot and a through hole which are communicated with each other, the through hole is communicated with the slot, the fixing portion is accommodated in the positioning slot and abuts the frame casing, the bent portion extends into the slot via the through hole to abut the docking element.

10. The connector according to claim 9, wherein the clip further comprises a leg connected to the fixing portion, the outer surface of the plug-in portion is provided with a fourth receptacle, the fourth receptacle is communicated with the positioning slot, and the leg is inserted into the fourth receptacle.

* * * * *